United States Patent
Adachi

(10) Patent No.: US 10,268,163 B2
(45) Date of Patent: Apr. 23, 2019

(54) ATOMIC OSCILLATOR AND METHOD FOR MANUFACTURING ATOMIC OSCILLATOR

(71) Applicant: Kazuhiko Adachi, Miyagi (JP)

(72) Inventor: Kazuhiko Adachi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 21 days.

(21) Appl. No.: 15/783,269

(22) Filed: Oct. 13, 2017

(65) Prior Publication Data

US 2018/0107167 A1    Apr. 19, 2018

(30) Foreign Application Priority Data

Oct. 19, 2016 (JP) .................................. 2016-205458
Jul. 25, 2017 (JP) .................................. 2017-143950

(51) Int. Cl.
  *G04F 5/14* (2006.01)
  *H03L 7/26* (2006.01)
  *H03B 17/00* (2006.01)

(52) U.S. Cl.
  CPC ................ *G04F 5/14* (2013.01); *G04F 5/145* (2013.01); *H03L 7/26* (2013.01); *H03B 17/00* (2013.01)

(58) Field of Classification Search
  CPC ...................................... G04F 5/14; H03L 7/26
  See application file for complete search history.

(56) References Cited

U.S. PATENT DOCUMENTS

| 9,019,024 B2 | 4/2015 | Maki |
| 9,293,422 B1 | 3/2016 | Parsa et al. |
| 2014/0232478 A1 | 8/2014 | Maki |
| 2015/0102863 A1* | 4/2015 | Hashi ................ H03L 7/26 331/94.1 |
| 2015/0180208 A1* | 6/2015 | Kaneko ............ G04F 5/145 372/50.11 |
| 2016/0269037 A1 | 9/2016 | Goka et al. |
| 2016/0329903 A1 | 11/2016 | Adachi et al. |

FOREIGN PATENT DOCUMENTS

| JP | 2014-157988 | 8/2014 |
| JP | 2015-070474 | 4/2015 |
| JP | 2015-164288 | 9/2015 |

OTHER PUBLICATIONS

Extended European Search Report for 171966443 dated Apr. 3, 2018.

* cited by examiner

*Primary Examiner* — Jeffrey M Shin
(74) *Attorney, Agent, or Firm* — IPUSA, PLLC

(57) ABSTRACT

An atomic oscillator includes a plurality of components, the components including a light source that emits excitation light, a gas cell in which an atom to be excited by the excitation light is sealed, and a photodetector that detects the excitation light transmitting through the gas cell; and a main part, wherein a part of the plurality of components are laminated in the main part. In a first component and a second component adjacent to each other of the main part, an electrically conductive film is formed on each of side surfaces of the first component and the second component; bonding patterns that are extended from the respective electrically conductive films and that face each other are formed on respective bonding surfaces facing each other of the first component and the second component; and the bonding patterns that face each other are bonded by a bonding material.

18 Claims, 9 Drawing Sheets

ATOMIC OSCILLATOR AND METHOD FOR MANUFACTURING ATOMIC OSCILLATOR

BACKGROUND OF THE INVENTION

1. Field of the Invention

The present disclosure relates to an atomic oscillator and a method for manufacturing an atomic oscillator.

2. Description of the Related Art

As a clock for measuring extremely accurate time, an atomic clock (atomic oscillator) has been known. An atomic clock is an oscillator that uses, as a standard, an amount of transition energy of an electron forming an atom of an alkali metal. Especially, in a state without any external perturbation, a very precise value can be obtained for transition energy of an electron included in an atom of an alkali metal. Consequently, a frequency stability of an atomic oscillator is higher in several orders compared to a frequency stability of a crystal oscillator.

For example, an atomic oscillator is configured such that a substrate on which a main part is disposed is accommodated in a case. Here, the main part includes a light source; a gas cell in which an alkali metal is sealed; a photodetector; and a heater. As an atomic oscillator provided with a main part, for example, a structure has been proposed such that a gas cell is fitted from both sides by two connection members with favorable thermal conductivity, and the connection members fitting the gas cell are mounted on a substrate. In such a structure, the connection members have a function for supporting the gas cell and a function for conducting heat from a heater on the substrate to the gas cell (cf. Patent Document 1 (Japanese Unexamined Patent Publication No. 2015-70474)).

However, for the above-described structure, a complicated process is required for fitting the two connection members with the gas cell. Furthermore, a dedicated device may be required for precise positioning of the connection members with respect to the gas cell because a bonding process using a resin adhesive is adopted for connecting the above-described members. As a result, mass production of the atomic oscillator may be difficult.

There is a need for an atomic oscillator that is suitable for mass production.

SUMMARY OF THE INVENTION

According to an aspect of the present disclosure, there is provided An atomic oscillator including a plurality of components, the plurality of components including a light source that emits excitation light, a gas cell in which an atom to be excited by the excitation light is sealed, and a photodetector that detects the excitation light transmitting through the gas cell; and a main part, wherein at least a part of the plurality of components is laminated in the main part, wherein, in a first component and a second component adjacent to each other of the main part, an electrically conductive film is formed on each of side surfaces of the first component and the second component; bonding patterns that are extended from the respective electrically conductive films and that face each other are formed on respective bonding surfaces facing each other of the first component and the second component; and the bonding patterns that face each other are bonded by a bonding material.

A method for manufacturing an atomic oscillator, wherein the atomic oscillator includes a plurality of components, the plurality of components including a light source that emits excitation light, a gas cell in which an atom to be excited by the excitation light is sealed, and a photodetector that detects the excitation light transmitting through the gas cell; and a main part, wherein at least a part of the plurality of components are laminated in the main part, the method including forming, in a first component and a second component adjacent to each other of the main part, an electrically conductive film on each of side surfaces of the first component and the second component and forming bonding patterns that are extended from the respective electrically conductive films and that face each other on respective bonding surfaces facing each other of the first component and the second component; and bonding the bonding patterns facing each other by a bonding material.

According to the disclosed technique, an atomic oscillator that is suitable for mass production can be provided.

Other objects, features and advantages of the present disclosure will become more apparent from the following detailed description when read in conjunction with the accompanying drawings.

DETAILED DESCRIPTION OF THE PREFERRED EMBODIMENTS

Figure 1:
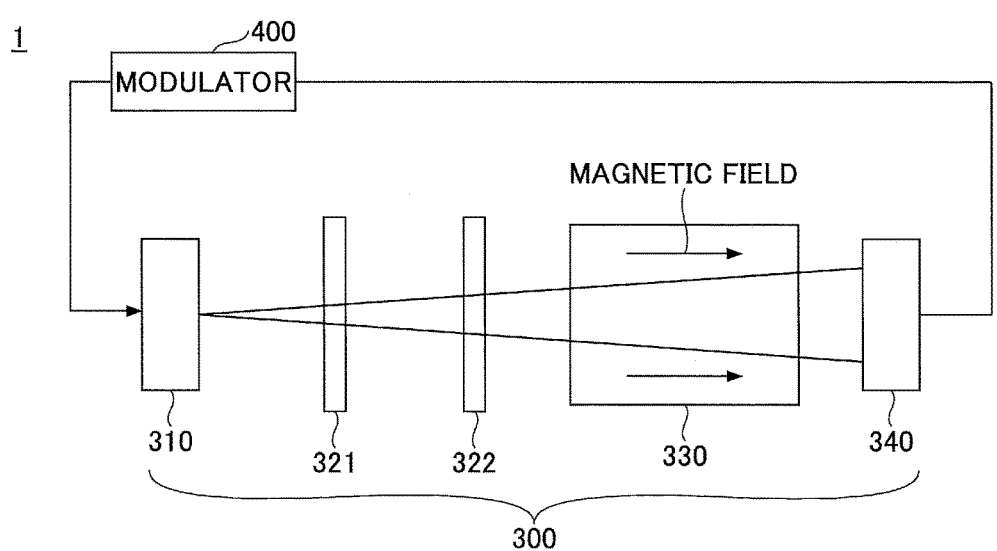
FIG. 1 is a diagram illustrating a basic configuration of an atomic oscillator.

In the following, by referring to the accompanying drawings, embodiments are described. In each drawing, the same reference numerals may be attached to the identical components and duplicate descriptions may be omitted.

Embodiment

FIG. 1 is a diagram illustrating a basic configuration of an atomic oscillator. Referring to FIG. 1, an atomic oscillator 1 is based on a Coherent Population Trapping (CPT) method. The atomic oscillator 1 is provided with a main part 300 and a modulator 400.

The main part 300 is provided with, for example, a light source 310; a quarter-wavelength wave plate 321; a Neutral Density (ND) filter 322; a gas cell 330 in which an atom of an alkali metal is sealed; and a photodetector 340. Here, a case is exemplified in which a laser element for emitting a laser beam, which can be excitation light, is used as the light source 310.

In the atomic oscillator 1, the laser beam emitted from the light source 310 is irradiated onto the gas cell 330 through the quarter-wavelength wave plate 321 and the ND filter 322, and the laser beam transmitting through the gas cell 330 enters the photodetector 340. Note that a magnetic field in a predetermined direction is applied to the gas cell 330.

The laser beam from the light source 310 is modulated, and, by sideband wavelengths generated at both sides of a carrier wave with a specific wavelength, two transitions of electrons in atoms of the alkali metal sealed in the gas cell 330 are simultaneously caused to excite the atoms of the alkali metal. For each transition, transition energy is a constant. When a sideband wavelength of the laser beam matches a wavelength corresponding to transition energy, electromagnetically induced transparency occurs such that a light absorption coefficient of the alkali metal decreases.

In the atomic oscillator 1, the light source 310 is controlled based on a light quantity of transmitted light that transmits through the gas cell 330. Specifically, the wavelength of the carrier wave is adjusted so that the light absorption coefficient of the alkali metal decreases, and, at the same time, the signal detected by the photodetector 340 is fed back to the modulator 400. Then, the modulation frequency of the laser beam from the laser source 310 is adjusted by the modulator 400.

Figure 2:
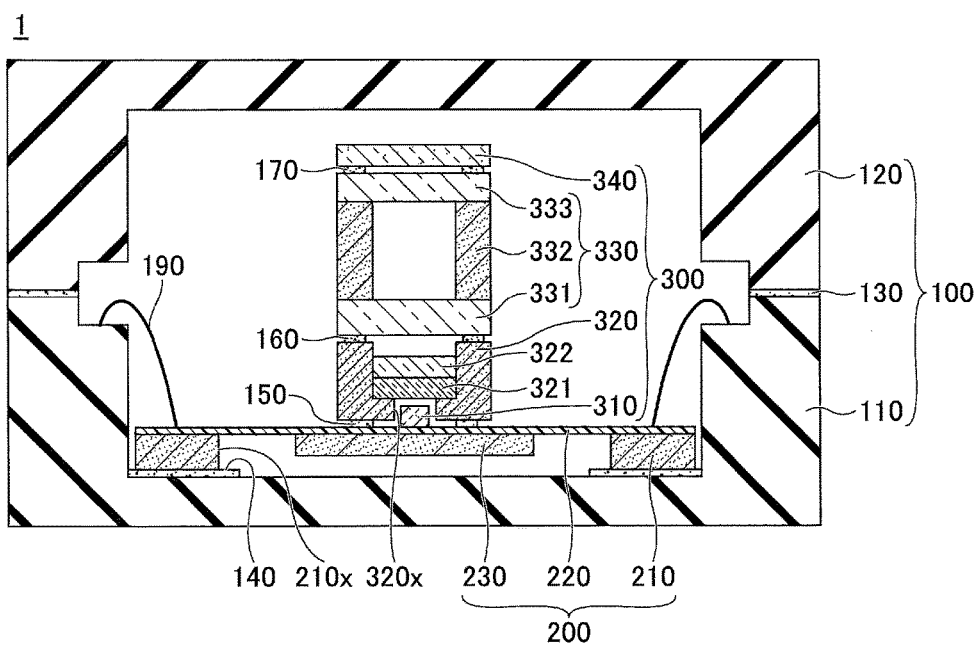
FIG. 2 is a cross-sectional view exemplifying an atomic oscillator according to an embodiment.
Figure 3:
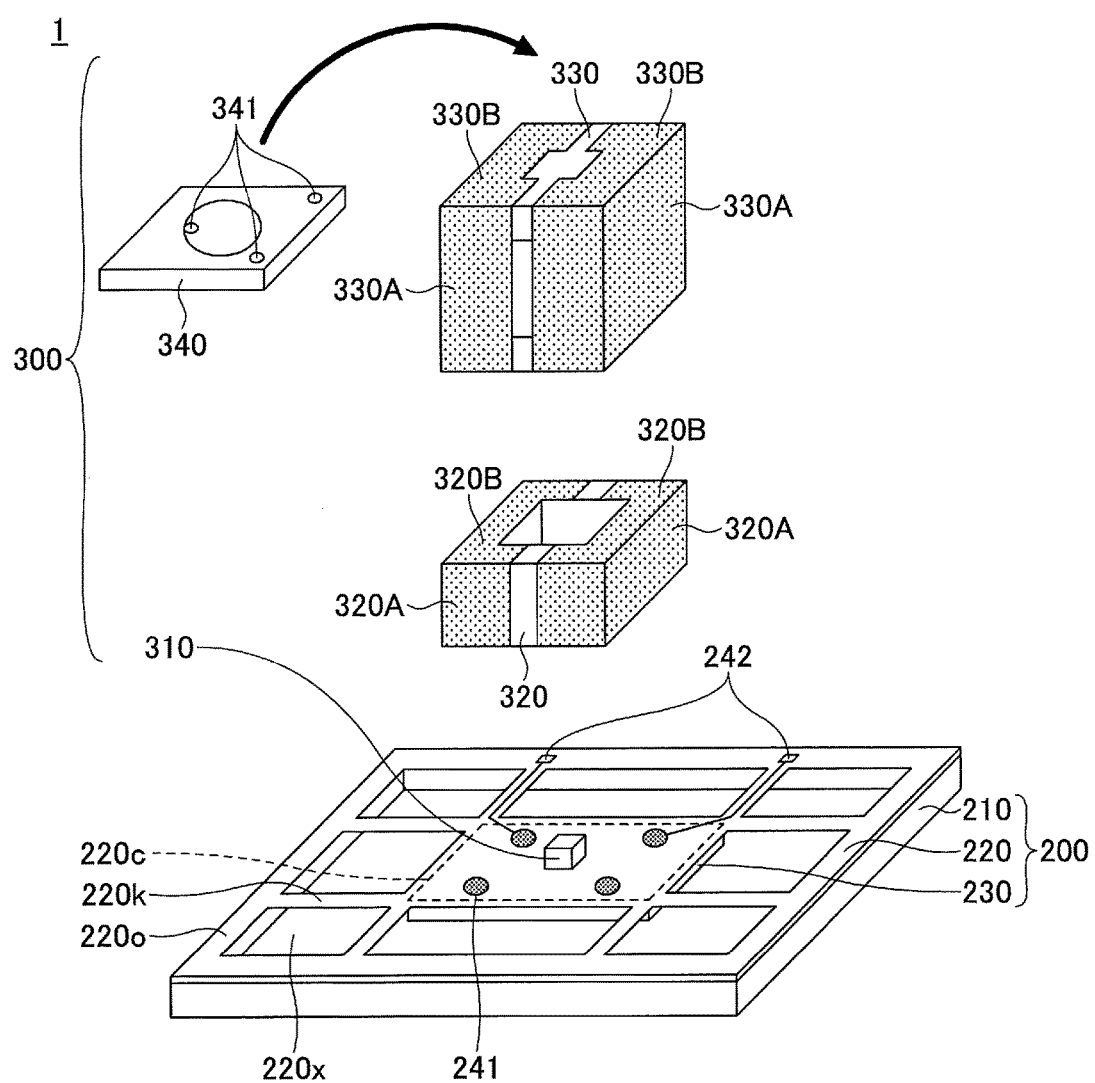
FIG. 3 is an exploded view exemplifying the atomic oscillator according to the embodiment.

FIG. 2 is a cross-sectional view exemplifying the atomic oscillator 1 according to the embodiment. FIG. 3 is an exploded view exemplifying the atomic oscillator 1 according to the embodiment.

Referring to FIG. 2 and FIG. 3, the atomic oscillator 1 has a structure such that a cross-linked structure 200 in which the main part 300 is located is accommodated in a vacuum-sealed package 100. However, the modulator 400 may be disposed outside the package 100. For example, the package 100 may have a structure such that a cavity 110 formed of a ceramic and a lid 120 formed of a ceramic are bonded by a bonding part 130, such as solder.

The cross-linked structure 200 is bonded on a bottom surface of the cavity 110 by a bonding part 140, such as solder. The cross-linked structure 200 includes a support substrate 210; an insulating film 220; and a base 230. A size of the planar shape of the cross-linked structure 200 may be approximately 10 mm×10 mm, for example.

In the embodiment, for convenience of the description, the side of the lid 120 is defined to be an upper side or one side, and the side of the cavity 110 is defined to be a lower side or the other side. Additionally, for each component, the surface at the side of the lid 120 is defined to be one surface or an upper surface, and the surface at the side of the cavity 110 is defined to be the other surface of a lower surface. Additionally, for each component, the surface connecting the upper surface and the lower surface is defined to be a side surface. However, it should be noted that the atomic oscillator 1 can be used in a state in which the atomic oscillator 1 is turned upside down, and that the atomic oscillator 1 can be used in a state in which the atomic oscillator 1 is tilted at any angle. Additionally, a planar view is defined to be viewing an object in a normal direction of the one surface of the insulating film 220, and a planar shape is defined to be a shape viewed in the normal direction of the one surface of the insulating film 220.

The support substrate 210 is a frame-shaped component in which a rectangular through hole 210x is formed at inner sides thereof. For example, the support substrate 210 may be formed of silicon.

The insulating film 220 is formed at the one side of the support substrate 210. The insulating film 220 includes an outer peripheral region 220o, a main part-located region 220c, and a bridge part 220k. As a material of the insulating film 220, for example, polyimide resin may be used. The film thickness of the insulating film 220 may be approximately 5 μm, for example. By adjusting the film thickness of the insulating film 220 to be as thin as approximately 5 μm, high thermal resistance can be achieved.

The outer peripheral region 220o is a frame-shaped region for covering the upper surface of the support substrate 210. The main part-located region 220c is a space reserved for securing the main part 300. The main part-located region 220c is disposed at an approximate center of the insulating film 220 located above the through hole 210x of the support substrate 210. The main part-located region 220c is separated from the outer peripheral region 220o.

The bridge part 220k bridges between the outer peripheral region 220o and the main part-located region 220c above the through hole 210x to support the main part-located region 220c. The length of the bridge part 220k may be, for example, approximately 2 mm, and the width of the bridge part 220k may be, for example, approximately 1 mm.

A plurality of openings 220x is formed in the insulating film 220 located at an inner side of the support substrate 210 (above the through hole 210x). By the openings 220x, the main part-located region 220c and the bridge parts 220k are divided (defined). In the embodiment, the eight bridge parts 220k are formed by the eight openings 220x. However, the number of the bridge parts 220k may be appropriately determined by considering the weight, etc., of the main part 300 to be installed.

The base 230 is formed below the lower surface of the main part-located region 220c. The base 230 is a component for reinforcing the strength of the insulating film 220. For example, the base 230 may be formed of silicon.

A pad disposed on the outer peripheral region 220o and a lead terminal of the cavity 110 are coupled through a bonding wire 190. The lead terminal of the cavity 110 is coupled to an external terminal formed outside the cavity 110 by a through electrode passing through the cavity 110. The external terminal can be coupled to the modulator 400 disposed outside the package 100.

The main part 300 is disposed at the main part-located region 220c located at the approximate center of the insulating film 220 forming the cross-linked structure 200. The main part 300 includes, as main components, the light source 310; a spacer 320; the gas cell 330; and the photodetector 340.

The light source 310 is implemented at the approximate center of the main part-located region 220c. As the light source 310, for example, a Vertical Cavity Surface Emitting LASER (VCSEL) may be used. As the photodetector 340, for example, a photodiode may be used.

Additionally, a temperature sensor for detecting a temperature of the light source 310, such as a thermistor or a thermocouple, a heater for controlling the temperature of the light source 310, and wires to be coupled to the light source 310, the temperature sensor, and the heater may be appropriately provided in the main part-located region 220c. For example, AuSn solder with a melting point of 280° C. may be used for implementing the light source 310 and the temperature sensor.

Additionally, the spacer 320 is bonded to the main part-located region 220c through a bonding part 150. The spacer 320 is a container component accommodating, in a vertical direction, the quarter-wavelength wave plate 321 and the ND filter 322, which are optical components. In the spacer 320, a through hole 320x is formed, which is for passing excitation light emitted from the light source 310. The spacer 320 may be formed of, for example, a glass or silicon.

The quarter-wavelength wave plate 321 has a function for converting excitation light emitted from the light source 310 from linearly polarized light into circularly polarized light. By irradiating circularly polarized excitation light onto atoms of an alkali metal in a state in which a magnetic field in a predetermined direction is applied to the gas cell 330, a number of atoms of the alkali metal with a desired energy level can be increased with respect to a number of atoms of the alkali metal with other energy levels. As a result, an oscillation characteristic of the atomic oscillator 1 can be enhanced.

The ND filter 322 has a function for adjusting (attenuating) the intensity of the excitation light emitted from the light source 310. By providing the ND filter 322, even if the intensity of the excitation light emitted from the light source 310 is high, the excitation light with proper intensity can be caused to enter the gas cell 330.

However, depending on the intensity of the excitation light emitted from the light source 310, the ND filter 322 may not be provided.

Note that, between the light source 310 and the gas cell 330, an optical element other than the quarter-wavelength wave plate 321 and the ND filter 322 may be provided. A collimator lens can be considered as an example of such an optical element.

Four bonding patterns 241 are formed in the main part-located region 220c so as to bond the spacer 320. Among the four bonding patterns 241, two bonding patterns 241 are coupled to pads 242, which are formed on the outer peripheral region 220o, for an anode terminal and a cathode terminal of the photodetector 340, respectively.

On the side surface of the spacer 320, an electrically conductive film 320A is formed. The electrically conductive film 320A is divided into two regions. Additionally, on each of the bonding surfaces of the spacer 320 (the upper surface and the lower surface of the spacer 320) facing the adjacent components in the vertical direction, bonding patterns 320B are formed, respectively, which are extended from the electrically conductive film 320A. Each of the bonding patterns 302B formed on the lower surface of the spacer 320 is coupled to the corresponding bonding patterns 241 through bonding part 150.

As a material of the bonding part 150, a bonding material (e.g., a conductive material suitable for bonding) may be used. In the following embodiment, a case is exemplified in which solder is used as the material of the bonding part 150. As a material of the bonding part 150, for example, AuSn solder with a melting point of 280° C., or solder with a melting point that is lower than the melting point of the AuSn solder (e.g., SnAgCu solder) may be used.

However, the material of the bonding part 150 is not limited to solder. A single element metal with a low melting point, such as indium and tin, may be used. The same applies to a bonding part 160, a bonding part 170, etc., which are described below.

The gas cell 330 is laminated on the top of the spacer 320. For example, the gas cell 330 is provided with a hollow structure such that an airtight space is formed by bonding, through a frame-shaped silicon substrate 332, outer edges of two glass substrates 331 and 333 facing each other. A gas formed of atoms of an alkali metal is sealed in the airtight space surrounded by the glass substrates 331 and 333 and the silicon substrate 332. Examples of an atom of an alkali metal include cesium, rubidium, sodium, etc.

The temperature inside the gas cell 330 can be adjusted to be a desired temperature by locating a heater in the vicinity of the gas cell 330 and heating the gas cell 330 by heat from the heater. As a result, the atoms of the alkali metal inside the gas cell 330 can be heated, and the atoms of the alkali metal inside the gas cell 330 can be maintained to be in a gaseous state with desired concentration.

In order to reduce energy consumption by the gas cell 330 as a result of heating the gas cell 330, the thermal resistance of the main part 300 including the gas cell 330 may preferably be made higher. Further, in order to reduce energy consumption by the main part 300, in addition to making the thermal resistance of the main part 300 to be high, it may be required to suppress radiation and/or to vacuum seal the main part 300.

On the side surface of the gas cell 330, an electrically conductive film 330A is formed. The electrically conductive film 330A is divided into two regions. Additionally, on each of the bonding surfaces of the gas cell 330 (the upper surface and the lower surface of the gas cell 330) facing the adjacent components in the vertical direction, bonding patterns 330B are formed, respectively, which are extended from the electrically conductive film 330A. The bonding patterns 330B formed on the lower surface of the gas cell 330 is coupled to the respective bonding patterns 320B formed on the upper surface of the spacer 320 through the bonding part 160.

As a material of the bonding part 160, a bonding material (e.g., a conductive material suitable for bonding) may be used. In the following embodiment, a case is exemplified in which solder is used as the material of the bonding part 160. As a material of the bonding part 160, for example, AuSn solder with a melting point of 280° C., or solder with a melting point that is lower than the melting point of the AuSn solder (e.g., SnAgCu solder) may be used.

At the uppermost part of the main part 300, the flip-chip implemented photodetector 340 is disposed on the bonding patterns 330B formed on the upper surface of the gas cell 330. Specifically, at the anode terminal and the cathode terminal of the photodetector 340, the gold bumps 341 are formed, and the photodetector 340 is flip-chip implemented on the respective bonding patterns 330B formed on the upper surface of the gas cell 330 through the bonding part 170.

As a material of the bonding part 170, a bonding material (e.g., a conductive material suitable for bonding) may be used. In the following embodiment, a case is exemplified in which solder is used as the material of the bonding part 170. As a material of the bonding part 170, for example, AuSn solder with a melting point of 280° C., or solder with a melting point that is lower than the melting point of the AuSn solder (e.g., SnAgCu solder) may be used.

Note that, in FIG. 3, for convenience of the description, a side of a light receiving surface of the photodetector 340 is illustrated. However, the photodetector 340 is actually disposed on the gas cell 330 while being inverted as illustrated by the arrow (the light receiving surface faces the upper surface of the gas cell 330).

The anode terminal and the cathode terminal of the photodetector 340 are coupled to the respective pads 242 through the bonding part 170; the bonding patterns 330B formed on the upper surface of the gas cell 330; the electrically conductive film 330A formed on the side surface of the gas cell 330; the bonding patterns 330B formed on the lower surface of the gas cell 330; the bonding part 160; the bonding patterns 320B formed on the upper surface of the spacer 320; the electrically conductive film 320A formed on the side surface of the spacer 320; the bonding patterns 320B formed on the lower surface of the spacer 320; the bonding part 150; and the bonding patterns 241.

Each of the electrically conductive films 320A and 330A formed on the side surface of the corresponding component has an effect of suppressing dissipation of the heat of the gas cell 330 due to radiation. Thermal radiation is a phenomenon such that the energy propagates through electromagnetic waves from a high temperature object to a low temperature object. Heat can move even in vacuum. In accordance with Stefan-Boltzmann law, in the wavelength distribution of electromagnetic waves radiated from a high temperature object, a ratio of electromagnetic waves with short wavelengths increases, as the temperature increases. However, when a temperature of an object is low, such as around 100° C., a majority of the electromagnetic waves radiated is in a range from an infrared region to a far infrared region.

To suppress a transfer of heat by thermal radiation, it is necessary to reduce an amount of the thermal radiation from a high temperature object and to reduce a ratio of absorption of heat by a low temperature object. A tendency to occur thermal radiation largely depends on a type and a surface state of a material, and the tendency to occur the thermal radiation is represented by a numerical value, which is referred to as an emissivity. As the emissivity becomes large, radiation tends to occur. In general, the emissivity of a metal is low, and the emissivity of a non-metal is high. Further, a surface that is smoothly polished has a low emissivity, and a rough surface or a metal covered with an oxide film has a large emissivity.

The glass substrates 331 and 333 and the silicon substrate 332 that form the gas cell 330 are disadvantageous,in a point of the thermal radiation because the emissivity of the glass substrates 331 and 333 and the silicon substrate 332 is high. The same applies to the spacer 320. Accordingly, the thermal radiation can be reduced, for example, by coating the surfaces of the gas cell 330 and the spacer 320, the rear surface of the base 230, and the rear surface of the photodetector 340 while using, as the electrically conductive films 320A and 330A, a metal material with low emissivity compared to the emissivity of a material to be coated.

The metal material with the low emissivity that forms the electrically conductive films 320A and 330A is not particularly limited. For example, as the metal material with the low emissivity, copper, silver, gold, chromium, nickel, aluminum, or an alloy thereof can be used. Especially, it is most preferable to use gold, which is chemically stable and does not form an oxide film.

Note that, in the embodiment, the electrically conductive film disposed at the side surface of each component is divided into two regions. However, the embodiment is not limited to this. For example, if one or more additional electric wires are required, the electrically conductive film disposed at the side surface of each component may be divided into three or more regions. Further, depending on necessity, a part of the conductive film may be extended to contact the heater for heating the gas cell 330.

Figure 4A:
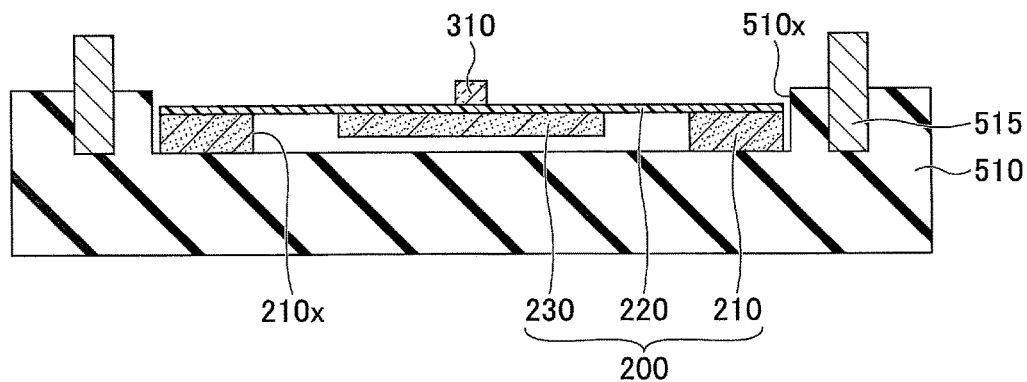
FIGS. 4A through 4C are diagrams exemplifying a manufacturing process of the atomic oscillator according to the embodiment.
Figure 4B:
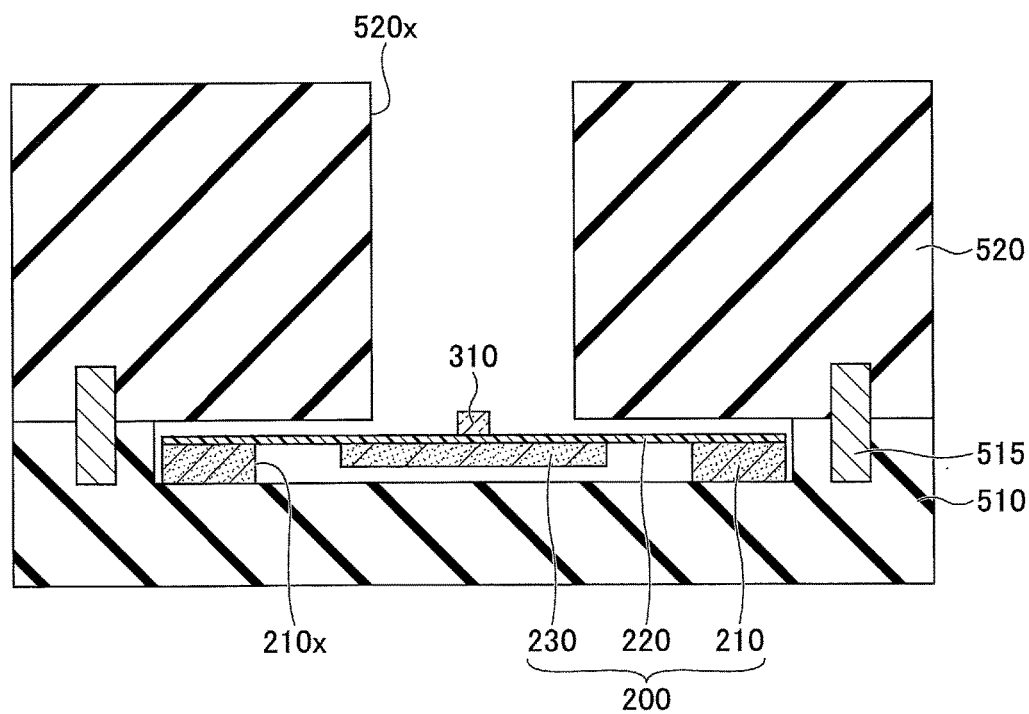
Figure 4C:
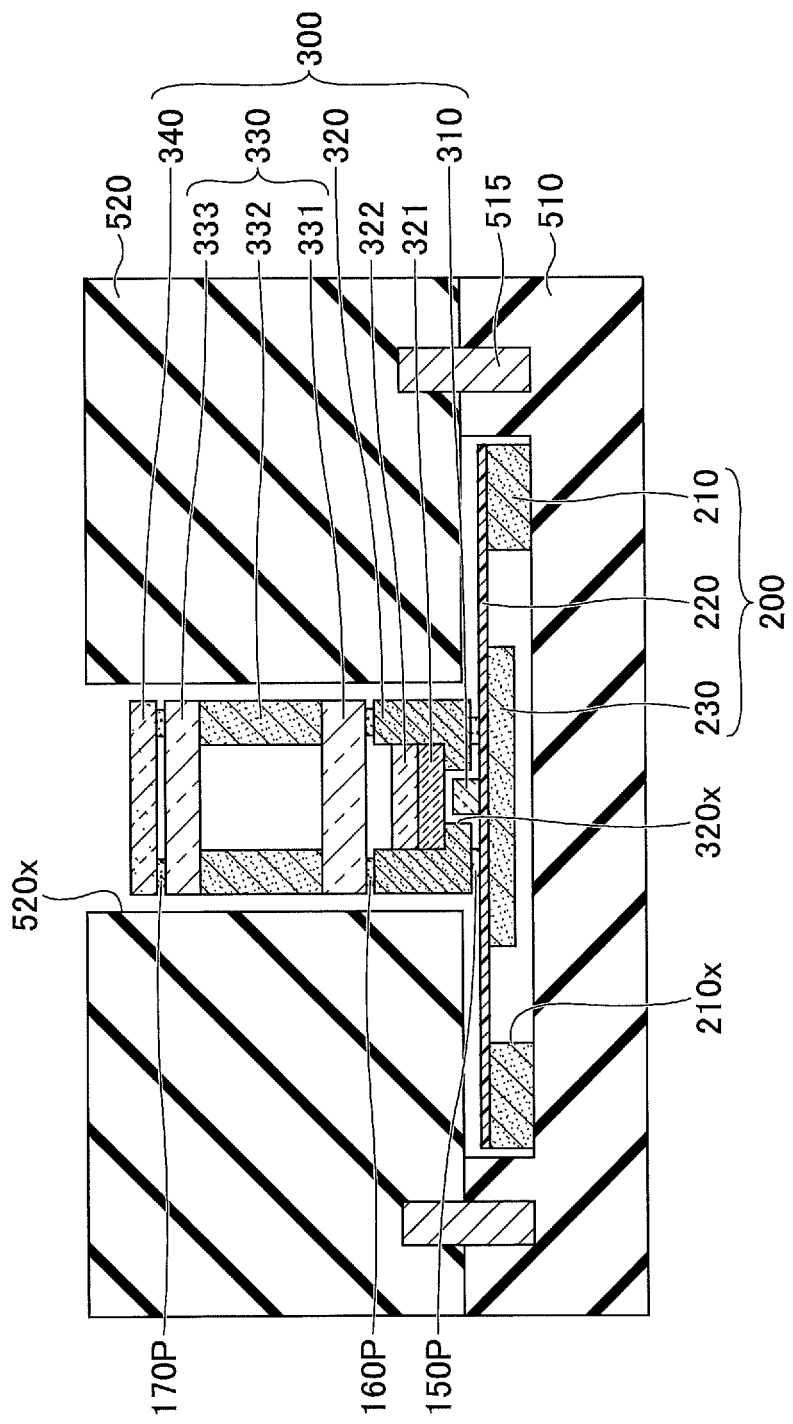
Figure 5A:
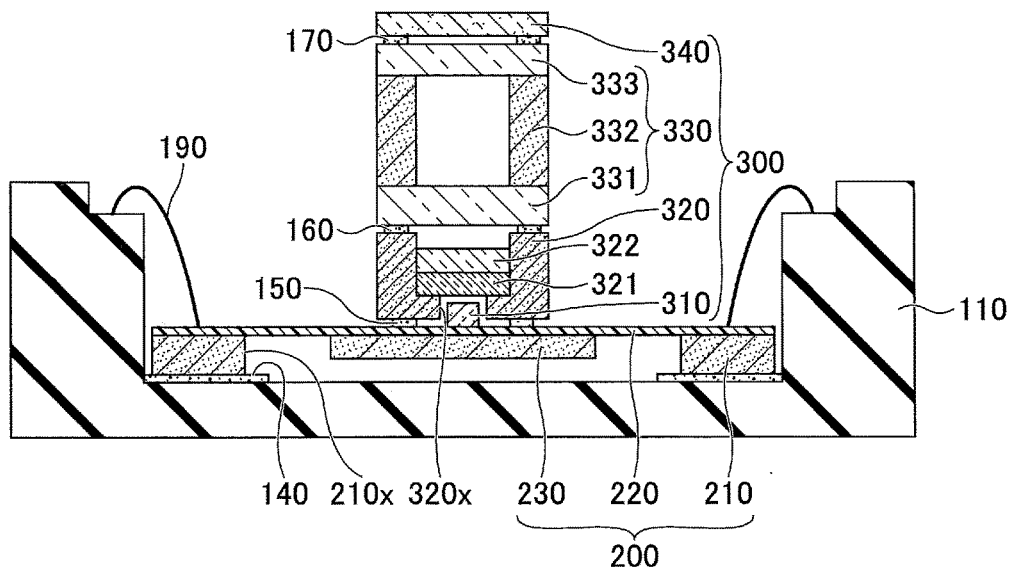
FIGS. 5A and 5B are diagrams exemplifying a continuation of the manufacturing process of the atomic oscillator according to the embodiment.
Figure 5B:
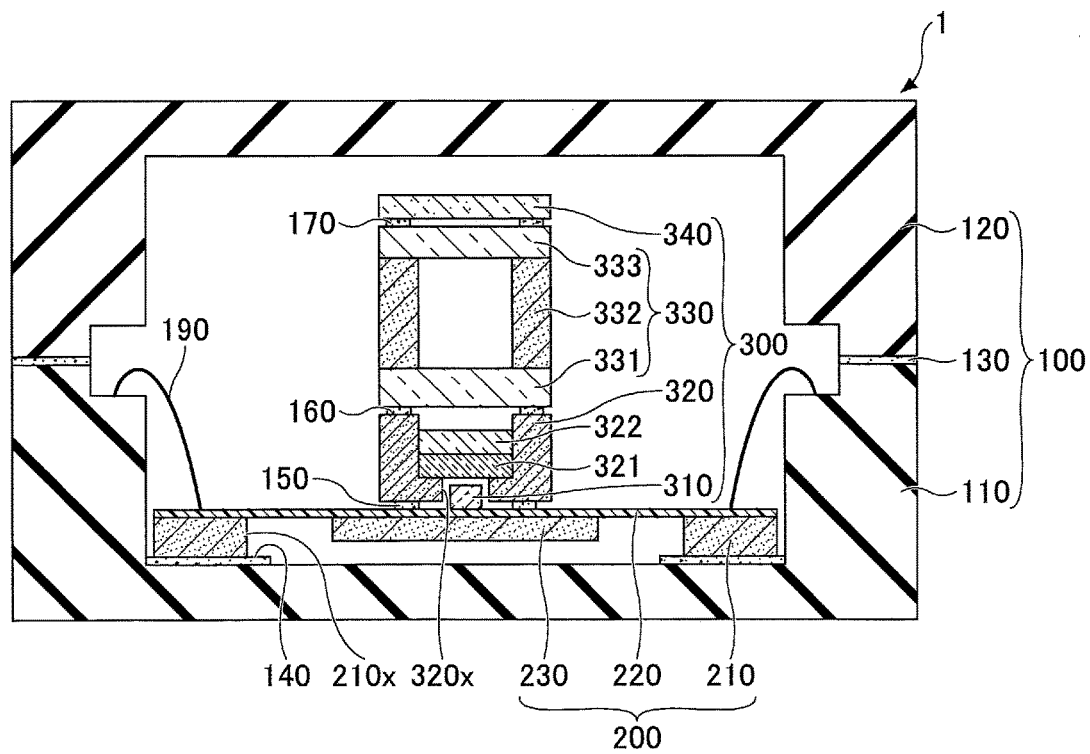

Next, by referring to FIG. 4 and FIG. 5, in addition to FIG. 3, a process of manufacturing the atomic oscillator 1 according to the embodiment is described. FIGS. 4A through 4C and FIGS. 5A and 5B are diagrams exemplifying the process of manufacturing the atomic oscillator 1 according to the embodiment.

First, the cross-linked structure 200 is manufactured. The support substrate 210 of the cross-linked structure 200 can be formed, for example, by a Micro Electronic Mechanical Systems (MEMS) technique using silicon. Furthermore, the insulating film 220 can be formed, for example, by a photolithography technique using a photosensitive polyimide resin. Furthermore, the wiring including the bonding patterns 241 and the pads 242 can be formed, for example, by forming a laminated film in which Ti, Pt, and Au are sequentially laminated by a vapor deposition method or a sputtering method and by patterning the laminated film by a lift-off method or a sputter etching method.

Next, the light source 310 is implemented (die-bonded) at the approximate center of the main part-located region 220c of the insulating film 220 of the cross-linked structure 200 using solder. Here, as an example, AuSn solder with a melting point of 280° C. is used for the implementation of the light source 310. After the implementation of the light source 310, as illustrated in FIG. 4A, the cross-linked structure 200 in which the light source 310 is implemented is accommodated in a concave portion 510x of an assembly jig 510. Note that a plurality of positioning pins 515 is provided in the assembly jig 510.

Next, as illustrated in FIG. 4B, an assembly jig 520 provided with an opening 520x is disposed on the assembly jig 510 using the positioning pins 515. Next, as illustrated in FIG. 4C, the components of the main part 300 other than the light source 310 are assembled in the main part-located region 220c. The main part 300 can be assembled as described below.

First, a solder foil 150P, which becomes the bonding part 150, is temporarily disposed on the bonding patterns 241 of the cross-linked structure 200 after applying propylene glycol onto the bonding patterns 241 of the cross-linked structure 200. As a material of the solder foil 150P, for example, AuSn solder with a melting point of 280° C., or solder with a melting point that is lower than the melting point of the AuSn solder (e.g., SnAgCu solder) may be used. The reason why it is preferable to use the AuSn solder or the solder with the melting point that is lower than the melting point of the AuSn solder is to avoid an adverse effect due to remelting of AuSn included in a die bonding material of the light source 310 that is die-bonded. Note that propylene glycol is removed in a subsequent formic acid thermal process.

Next, the spacer 320 is disposed in the main part-located region 220c. The spacer 320 accommodates the quarter-wavelength wave plate 321 and the ND filter 322 in the vertical direction. Note that the electrically conductive film 320A is formed on the two regions of the side surface of the spacer 320 and the bonding pattern 320B is formed in the upper surface and the lower surface of the spacer 320. The spacer 320 is disposed, so that the bonding patterns 320B formed at the lower surface face the bonding patterns 241 through the solder foil 150P.

Note that the electrically conductive film 320A and the bonding patterns 320B can be formed, for example, by using a sputtering device. When a component below the electrically conductive film 320A (the spacer 320 in this process) is not an insulator, the electrically conductive film 320A and the bonding pattern 320B are formed after forming an insulator (e.g., a silicon oxide and a silicon nitride) as the component below the electrically conductive film 320A.

Each of the electrically conductive film 320A and the bonding patterns 320B may be a laminated film in which a plurality of films are laminated. In this case, the outermost surface of each of the electrically conductive film 320A and the bonding patterns 320B may be coated with a metal with low emissivity with respect to infrared light, such as gold. Further, in order to prevent disconnection due to dissolution of gold by solder, platinum may be formed in a lower layer of gold. Furthermore, in order to enhance adhesiveness between platinum and the insulator, titanium or chromium may be formed in a lower layer of platinum.

Specifically, for example, in a sputtering device, an insulator film can be formed and then an electrically conductive film can be continuously formed. During the film formation, by shielding, with a metal mask, a part that is not to be coated, the plurality of conductive films 320A and the plurality of bonding patterns 320B can be formed. The electrically conductive film 320A and the bonding patterns 320B may be formed by using any other generic semiconductor photolithography technique or thin film deposition technique.

Subsequently, propylene glycol coating, temporary placing of a solder foil 160P, which becomes the bonding part 160, and propylene glycol coating are sequentially performed on the bonding patterns 320B formed on the upper surface of the spacer 320. As a material of the solder foil 160P, for example, AuSn solder with a melting point of 280° C., or solder with a melting point that is lower than the melting point of the AuSn solder (e.g., SnAgCu solder) may be used. Note that propylene glycol is removed at the formic acid thermal process in the subsequent process.

Subsequently, the gas cell 330 is disposed on the upper surface of the spacer 320. For example, the gas cell 330 is provided with a structure such that the outer edges of the two glass substrates 331 and 333 facing each other are bonded through the frame-shaped silicon substrate 332. In the region surrounded by the glass substrates 331 and 333 and the silicon substrate 332, the gas of atoms of the alkali metal is sealed. Bonding of the glass substrate 331 and 333 and the silicon substrate 332 can be made, for example, by anodic bonding.

In the two regions of the side surfaces of the gas cell 330, the electrically conductive films 330A are formed, and the bonding patterns 330B extended from the electrically conductive films 330A are formed on the upper and lower surfaces of the gas cell 330. The gas cell 330 is disposed so that the bonding patterns 330B formed on the lower surface face the bonding patterns 320B formed on the upper surface of the spacer 320 through the solder foil 160P. Note that the conductive films 330A and the bonding patterns 330B may be formed, for example, by a method that is the same as the method of forming the electrically conductive films 320A and the bonding patterns 320B.

Subsequently, propylene glycol coating, temporary placing of a solder foil 170P, which becomes the bonding part 170, and propylene glycol coating are sequentially performed on the bonding patterns 330B formed on the upper surface of the gas cell 330. As a material of the solder foil 170P, for example, AuSn solder with a melting point of 280° C., or solder with a melting point that is lower than the melting point of the AuSn solder (e.g., SnAgCu solder) may be used. Note that propylene glycol is removed at the formic acid thermal process in the subsequent process.

Subsequently, on the bonding patterns 330B formed on the upper surface of the gas cell 330, the photodetector 340 with the anode terminal and the cathode terminal, for which the gold bumps 341 are formed, is flip-chip disposed. The photodetector 340 is disposed so that the anode terminal and the cathode terminal face, through the gold bumps 341, the solder foil 170P temporarily placed on the bonding patterns 330B formed on the upper surface of the gas cell 330.

Here, the planar shapes of the spacer 320, the gas cell 330, and the photodetector 340 are made approximately the same, and the planar shape of the opening 520x of the assembly jig 520 is made slightly greater than the planar shapes of the spacer 320, the gas cell 330, and the photodetector 340. As a result, the bonding patterns 241, the spacer 320, the gas cell 330, and the photodetector 340 can be easily positioned.

Note that the clearance between the opening 520x of the assembly jig 520 and the spacer 320, the gas cell 330, and the photodetector 340 can be appropriately determined based on the positioning accuracy determined by the bonding patterns.

Next, the assembly jigs 510 and 520 illustrated in FIG. 4C is placed in a chamber of a device dedicated to formic acid processing. After removing oxides in a formic acid reduction atmosphere at approximately 200° C., soldering is performed at a temperature that is higher than or equal to the melting point of the solder foils 150P, 160P, and 170P. In the soldering process, positioning of each component is performed by using the self-alignment effect utilizing the surface tension generated when the solder foils 150P, 160P, and 170P melt.

Here, the self-alignment means that the positional deviation of each component is corrected by the restoring force generated by the surface tension of the melted and liquefied solder foil, and that the positioning of each component is automatically performed.

Note that fluxless soldering can be made possible by performing the process of bonding using the solder in the formic acid reducing atmosphere. Accordingly, the solder bonding can be made possible in which deterioration of the characteristics of the optical elements by the flux is prevented and the effect of the gas escaping from the flux is removed.

Subsequently, propylene glycol coating, temporary placing of a solder foil, which becomes the bonding part 140, and propylene glycol coating are sequentially performed at predetermined positions of the four corners inside the cavity 110 formed of ceramic, etc.

Then, as illustrated in FIG. 5A, the cross-linked structure 200 in which the main part 300 is disposed is taken out from the assembly jigs 510 and 520 illustrated in FIG. 4C, and the cross-linked structure 200 is placed inside the cavity 110. The cross-linked structure 200 is placed inside the cavity 110, so that the lower surface of the support substrate 210 contacts the solder foil, which becomes the bonding part 140.

After that, the cavity 110 and the support substrate 210 are soldered by heating the cavity 110 with a hot plate to melt and solidify the solder foil, which becomes the bonding part 140. As the material of the solder foil, which becomes the bonding part 140, for example, AuSn solder with a melting point of 280° C., or solder with a melting point that is lower than the melting point of the AuSn solder (e.g., SnAgCu solder) may be used. Next, the wiring pad disposed on the outer peripheral region 220o is coupled to the lead terminal of the cavity 110 through the bonding wire 190.

Subsequently, as illustrated in FIG. 5B, a solder foil, which becomes the bonding part 130, is formed in a flame shape on the outer frame of the cavity 110, and the lid 120 is disposed. Then, the cavity 110 and the lid 120 are sealed by heating the solder foil, which becomes the bonding part 130, in vacuum, so that the solder foil is melted and then solidified. As the material of the solder foil, which becomes the bonding part 130, solder with the lowest melting point among the melting points of the types of solder used for assembling the main part 300 or solder with a melting point lower than the lowest melting point is used. By the above-described process, the atomic oscillator 1 is completed.

Note that, in the above-described process, the supply of the solder foils for bonding the components is performed in the assembly process. However, a solder foil may be formed, in advance, on a bonding pattern of each component prior to assembling the main part 300.

As described above, in the atomic oscillator 1, the electrically conductive films divided into the plurality of regions are formed on the side surfaces of of the spacer 320 and the gas cell 330, which are components adjacent to each other in the main part 300. Then, on the bonding surfaces facing each other of these adjacent components, bonding patterns are formed that are extended from the corresponding electrically conductive films and that face each other. The bonding patterns facing each other are bonded by soldering.

Namely, the main part 300 of the atomic oscillator 1 does not have a complicated structure in which the two connection members are fitted to the gas cell, such as the structure described in the description of the related art. Further, for bonding the adjacent components, solder is used, and no resin adhesive is used.

In the manufacturing process of the atomic oscillator 1, during bonding of the adjacent components, positioning is performed in which the self-alignment effect of the solder is used. Accordingly, a dedicated device (e.g., a die bonder) for accurate positioning in the related art is not required, and the less expensive main part 300 with three-dimensional structure can be manufactured. Furthermore, the adjacent components included in the main part 300 can be bonded simply by laminating the components on the simple jig with alignment accuracy of approximately the size of the bonding patterns and performing thermal processing. Accordingly, the atomic oscillator 1 can be obtained which is superior in mass productivity.

Furthermore, no resin adhesive is used for bonding the adjacent components. Accordingly, it is possible to prevent deterioration of the characteristics of the atomic oscillator 1 caused by a gas generated from a resin adhesive, as a gas generation source in the package 100.

Further, by disposing the electrically conductive films on the side surfaces of the respective components forming the main part 300, heat loss caused by radiation can be suppressed. Thus, the main part 300 can be easily maintained at an appropriate temperature, and energy consumption by the atomic oscillator 1 can be reduced.

Furthermore, in the adjacent components, the bonding patterns facing each other are formed by extending the parts of the electrically conductive films. The bonding patterns facing each other can be bonded using solder. Consequently, the electrical connection between the uppermost photodetector 340 and the pad on the insulating film 220 can be made without using bonding wire, so that the assembly of the main part 300 can be facilitated.

Note that, by using, at the bonding parts, AuSn solder including, as a main component, gold that has a large surface tension, the restoring force generated by the surface tension of the melted and liquefied solder becomes large. Accordingly, favorable self-alignment can be achieved.

Another Embodiment

In this embodiment, a case is exemplified such that, on each bonding surface, a plurality of bonding patterns is formed that is extended from one electrically conductive film formed on a side surface. Note that, in this embodiment, a description of a component that is the same as the corresponding component of the above-described embodiment may be omitted.

Figure 6:
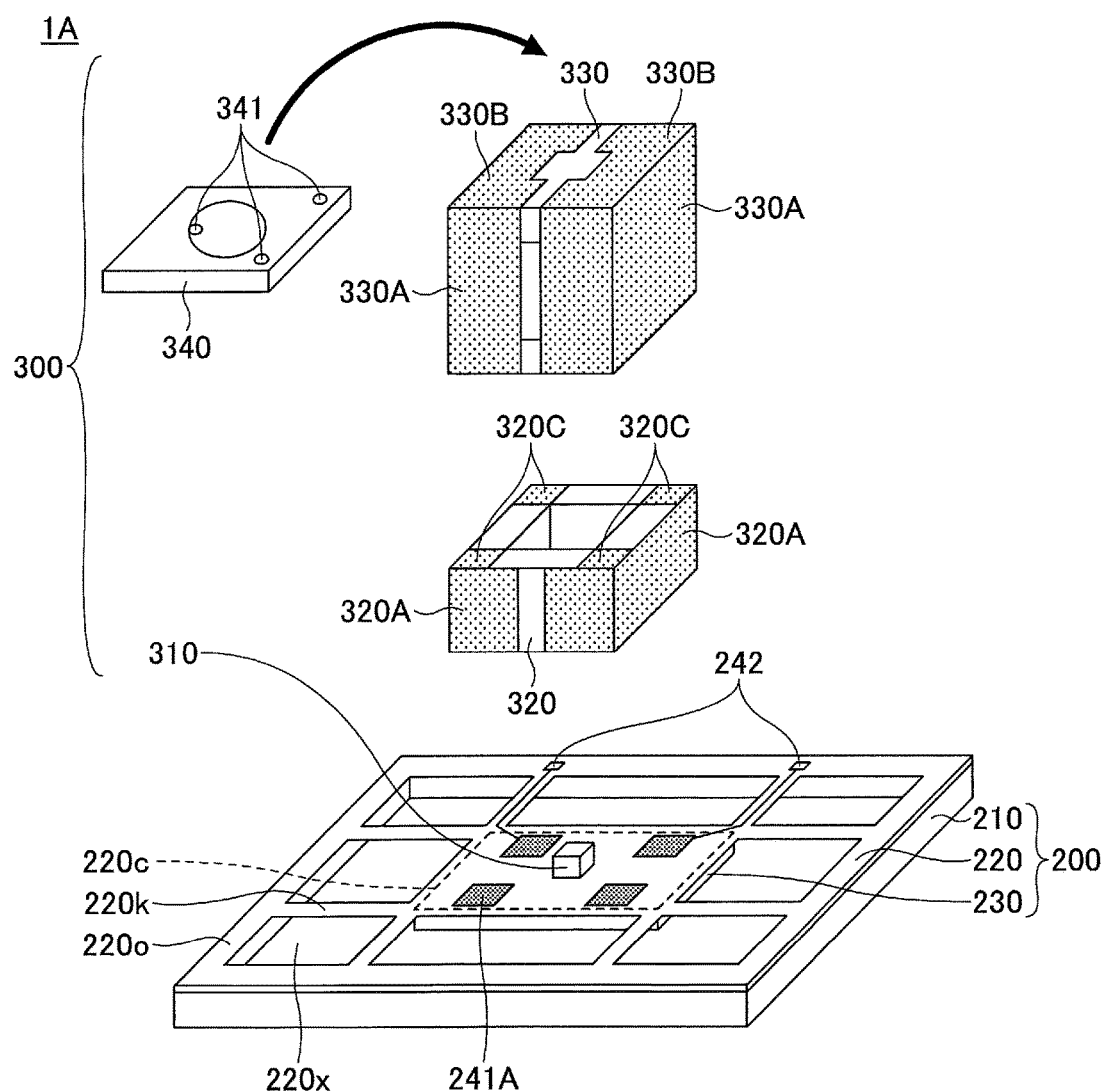
FIG. 6 is an exploded view exemplifying an atomic oscillator according to another embodiment.

FIG. 6 is an exploded view exemplifying an atomic oscillator 1A according to the embodiment. Referring to FIG. 6, in the atomic oscillator 1A, electrically conductive films 320A are formed in the two regions on the side surfaces of the spacer 320, similar to the atomic oscillator 1.

However, unlike the atomic oscillator 1, each electrically conductive film 320A on the side surfaces of the spacer 320 is extended to the bonding surfaces for the adjacent components on the upper and lower sides. For one electrically conductive film 320A, bonding patterns 320C are formed in respective two regions at the corner on the upper surface and the corner on the lower surface.

In other words, on the upper surface of the spacer 320, the bonding patterns 320C at the two regions extended from one of the electrically conductive film 320A and the bonding patterns 320C at the two regions extended from the other electrically conductive film 320A are disposed at the four corners.

Similarly, on the lower surface of the spacer 320, the bonding patterns 320C at the two regions extended from one of the electrically conductive film 320A and the bonding patterns 320C at the two regions extended from the other electrically conductive film 320A are disposed at the four corners. The planar shape of each bonding pattern 320C can be, for example, a square shape.

In the main part-located region 220c, four bonding patterns 241A are formed so as to bond the spacer 320. Two bonding patterns 241A of the four bonding patterns 241A are respectively coupled to the pads 242 for the anode and cathode of the photodetector 340 formed on the outer peripheral region 220o.

The planar shape of each bonding pattern 241A corresponds to the planer shape of each bonding pattern 320C. For example, the planar shape of each bonding pattern 241A may be a square shape.

As described above, by dividing the bonding pattern extended to the bonding surfaces for the adjacent components at the upper side and the lower side into a plurality of patterns, an amount of solder consumed for bonding with the adjacent components on the upper and lower sides can be reduced. Furthermore, by dividing the bonding pattern extended to the bonding surfaces for the adjacent components at the upper side and the lower side into the plurality of patterns and relatively separating the solder bonding parts from each other, the restoring force during self-alignment can be increased. Accordingly, more accurate positioning with the adjacent components at the upper and lower sides can be performed.

Another Embodiment

In this embodiment, a case is exemplified in which electrically conductive films and bonding patterns are formed on the quarter-wavelength wave plate 321 and the ND filter 322. Note that, in this embodiment, a description of a component that is the same as the corresponding component of any of the above-described embodiments may be omitted.

Figure 7:
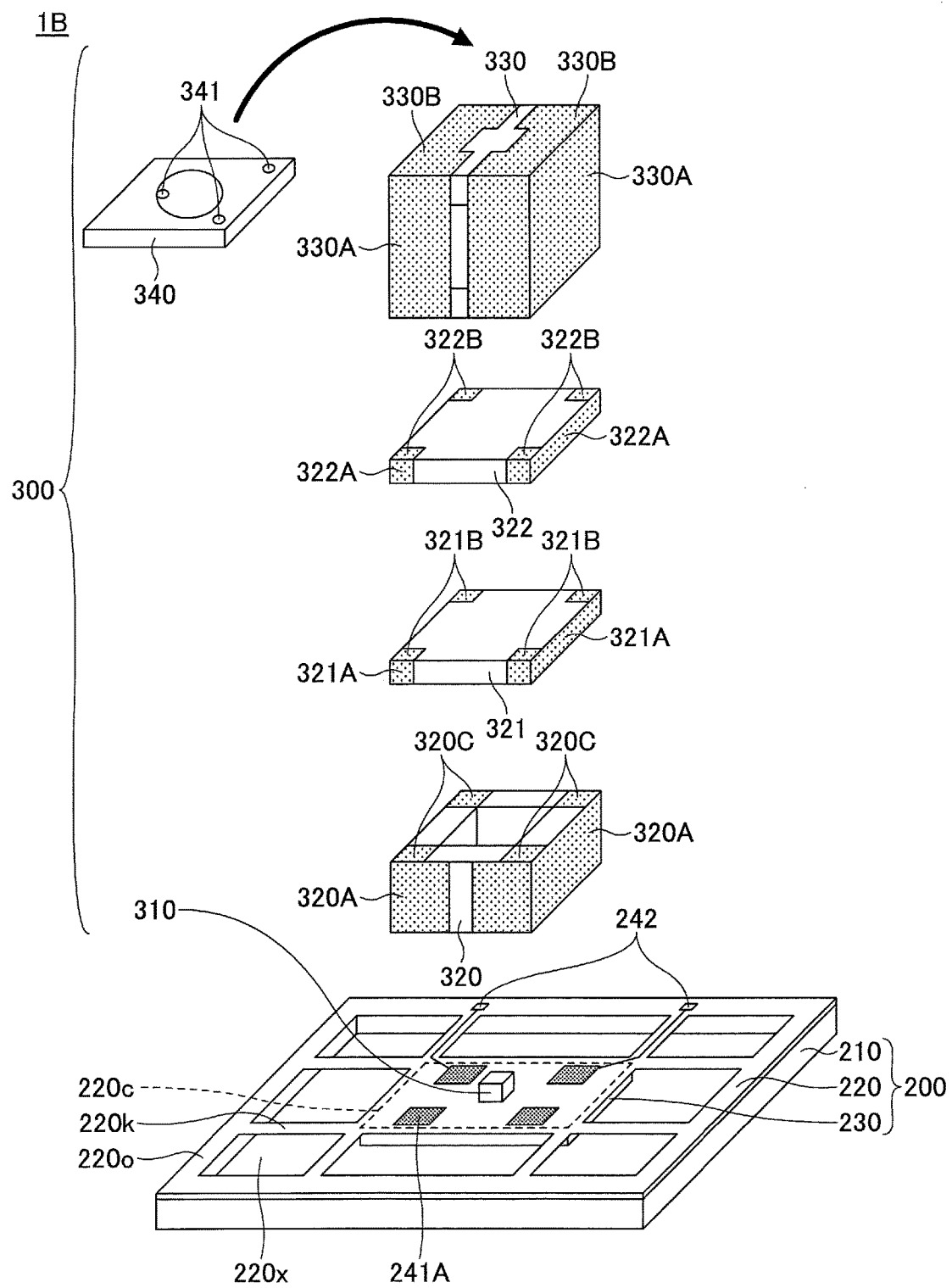
FIG. 7 is an exploded view exemplifying an atomic oscillator according to another embodiment.

FIG. 7 is an exploded view exemplifying an atomic oscillator 1B according to the embodiment. Referring to FIG. 7, in the atomic oscillator 1B, electrically conductive films 321A are formed on the two regions of the side surfaces of the quarter-wavelength wave plate 321. Further, each electrically conductive film 321A on the side surfaces of the quarter-wavelength wave plate 321 is extended to bonding surfaces for the adjacent components at the upper side and the lower side. In one electrically conductive film 321A, bonding patterns 321B are respectively formed at two regions at the corners on the upper surface and the lower surface.

In other words, on the upper surface of the quarter-wavelength wave plate 321, the bonding patterns 321B at the two regions extended from one of the conductive films 321A and the bonding patterns 321B at the two regions extended from the other conductive film 321A are disposed at the four corners.

Similarly, on the lower surface of the quarter-wavelength wave plate 321, the bonding patterns 321B at the two regions extended from one of the conductive films 321A and the bonding patterns 321B at the two regions extended from the other conductive film 321A are disposed at the four corners. The planer shape of each bonding pattern 321B can be a square shape, for example.

Further, electrically conductive films 322A are formed at the two regions on the side surfaces of the ND filter 322. Further, each electrically conductive film 322A on the side surfaces of the ND filter 322 is extended to bonding surfaces for the adjacent components at the upper side and the lower side. In one electrically conductive film 322A, bonding patterns 322B are respectively formed at two regions at the corners on the upper surface and the lower surface.

In other words, on the upper surface of the ND filter 322, the bonding patterns 322B at the two regions extended from one of the conductive films 322A and the bonding patterns 322B at the two regions extended from the other conductive film 322A are disposed at the four corners.

Similarly, on the lower surface of the ND filter 322, the bonding patterns 322B at the two regions extended from one of the conductive films 322A and the bonding patterns 322B at the two regions extended from the other conductive film 322A are disposed at the four corners. The planer shape of each bonding pattern 322B can be a square shape, for example.

The bonding patterns 320C on the upper surface of the spacer 320 and the bonding patterns 321B at the lower surface of the quarter-wavelength wave plate 321 are bonded by self-alignment by the solder that is similar to the solder of the bonding parts 160 and 170. The bonding patterns 321B at the upper surface of the quarter-wavelength wave plate 321 and the bonding patterns 322B at the lower surface of the ND filter 322 are bonded by self-alignment by the solder that is similar to the solder of the bonding parts 160 and 170. Furthermore, the bonding patterns 322B on the upper surface of the ND filter 322 and the bonding patterns 330B at the lower surface of the gas cell 330 are bonded by self-alignment by the bonding part 170. Assembling of each component illustrated in FIG. 7 can be performed by using the assembling jig that is the same as the assembling jig of FIG. 4.

As described above, the electrically conductive films and the bonding patterns may be formed on the quarter-wavelength wave plate 321 and the ND filter 322. In this case, compared to a case where the quarter-wavelength wave plate 321 and the ND filter 322 are accommodated in the spacer 320, a simple hollow spacer structure can be obtained. Thus, this case is advantageous in a point that the cost for the parts can be reduced.

Further Embodiment

In this embodiment, a case is exemplified in which an arrangement of the photodetector 340 is different from the arrangement of the the photodetector 340 of the above-described embodiment. Note that, in this embodiment, a description of a component that is the same as the corresponding component of any of the above-described embodiments may be omitted.

Figure 8:
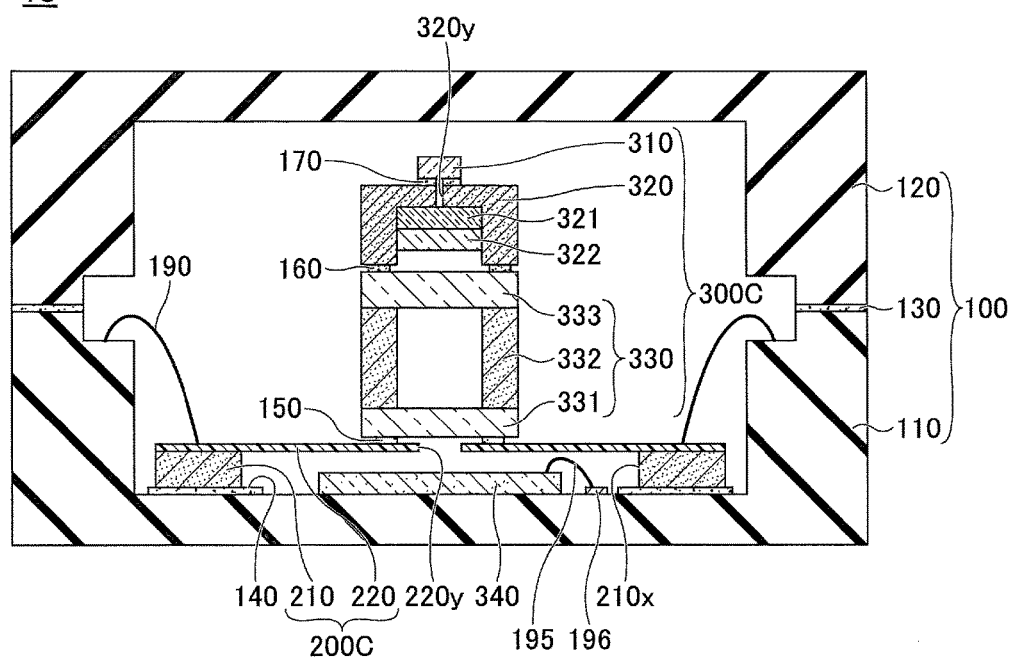
FIG. 8 is a cross-sectional view exemplifying an atomic oscillator according to a further embodiment.

FIG. 8 is a cross-sectional view exemplifying an atomic oscillator 1C according to the embodiment. Referring to FIG. 8, in the atomic oscillator 1C, a cross-linked structure 200C is bonded to the bottom surface of the cavity 110 by the bonding part 140, such as solder. The cross-linked structure 200C is provided with the support substrate 210 and the insulating film 220 (the base 230 is not included).

Further, in the atomic oscillator 10, the photodetector 340 is separated from an main part 300C, and the photodetector 340 is implemented on the bottom surface of the cavity 110. The photodetector 340 is disposed on the side opposite to the main part 300C through the insulating film 220. The photodetector 340 is implemented, so that the light receiving part of the photodetector 340 faces the insulating film 220. The anode and the cathode of the photodetector 340 are respectively coupled to the pads 196 formed on the bottom surface of the cavity 110 through the bonding wires 195.

The main part 300C is disposed at the main part-located region 220c located at the approximate center of the insulating film 220 forming the cross-linked structure 200C. The main part 300C is provided with, as the main components, the light source 310; the spacer 320, and the gas cell 330.

Unlike the main part 300, in the main part 300C, the gas cell 330 is implemented at the main part-located region 220c through the bonding part 150. Further, at the upper part of the gas cell 330, the spacer 320, in which the quarter-wavelength wave plate 321 and the ND filter 322 are accommodated in the vertical direction, is bonded through the bonding part 160, while the ND filter 322 faces the gas cell 330. Note that the structures of the electrically conductive films and the bonding patterns in the spacer 320 and the gas cell 330 and the method of bonding the adjacent components are the same as the case of the main part 300.

At the upper part of the spacer 320, the light source 310 is bonded through the bonding part 170. The light source 310 is implemented, so that the light emitting part of the light source 310 faces the spacer 320. In the spacer 320, a through hole 320y is formed. Excitation light emitted from the light source 310 passes through the through hole 320y.

The connecting terminals of the light source 310 are coupled to the respective pads for the light source 310 formed on the insulating film 220 through the bonding part 170; the bonding patters 320B formed on the upper surface of the spacer 320; the electrically conductive films 320A formed on the side surfaces of the spacer 320; the bonding patterns 320B formed on the lower surface of the spacer 320; the bonding part 160; the bonding patterns 330B formed on the upper surface of the gas cell 330; the electrically conductive films 330A formed on the side surfaces of the gas cell 330; the bonding patterns 330B formed on the lower surface of the gas cell 330; and the bonding part 150.

The excitation light emitted from the light source 310 passes through the through hole 320y formed in the spacer 320 and reaches the gas cell 330 through the quarter-wavelength wave plate 321 and the ND filter 322. The light that transmits the gas cell 330 passes through the opening 220y formed in the insulating film 220 and enters the light receiving part of the photodetector 340.

As described above, by separating the photodetector 340 from the main part 300C, the wiring for the photodetector 340 formed on the insulating film 220 of the support substrate 210 can be reduced. As a result, heat loss can be suppressed and the thermal resistance of the insulating film 220 can further be increased. Thus, a low energy consumption main part can be obtained.

CONCLUSION (1) As described above, according to the embodiments, there is provided an atomic oscillator including a plurality of components, the plurality of components including a light source that emits excitation light, a gas cell in which an atom to be excited by the excitation light is sealed, and a photodetector that detects the excitation light transmitting through the gas cell; and a main part, wherein at least a part of the plurality of components is laminated in the main part, wherein, in a first component and a second component adjacent to each other of the main part, an electrically conductive film is formed on each of side surfaces of the first component and the second component; bonding patterns that are extended from the respective electrically conductive films and that face each other are formed on respective bonding surfaces facing each other of the first component and the second component; and the bonding patterns that face each other are bonded by a bonding material.

(2) The photodetector may include, as connecting terminals, an anode terminal and a cathode terminal, wherein the electrically conductive film may be divided, and one of the divided electrically conductive film may be connected to the anode terminal and the other divided electrically conductive film may be connected to the cathode terminal.

(3) The photodetector may be coupled to one surface of the first component on which the divided electrically conductive films are formed, and the second component is coupled to the other surface of the first component.

(4) The main part may include the light source, the gas cell that is the first component, and the photodetector, wherein the main part may be disposed on an insulating film, wherein, at an upper most part of the main part, the photodetector that may be flip-chip implemented on the bonding pattern formed on an upper surface of the gas cell is disposed, wherein the second components may be disposed between the gas cell and the insulating film, and wherein the photodetector may include connecting terminals, and the connecting terminals of the photodetector may be respectively connected to pads formed on the insulating film through, at least, the electrically conductive films formed on the side surfaces of the first component and the electrically conductive films formed on the side surfaces of the second component.

(5) The second component may be a container for accommodating an optical element disposed between the light source and the gas cell.

(6) The second component may be an optical element disposed between the light source and the gas cell.

(7) The insulating film may include an outer peripheral region having a frame shape, a main part-located region disposed at an inner side of the outer peripheral region, the main part-located region being separated from the outer peripheral region, and a bridge part that bridges the outer peripheral region and the main part-located region to support the main part-located region, wherein the main part may be disposed on an upper surface of the main part-located region, wherein at least one of the plurality of components may have a hollow structure, wherein a base may be provided on a lower surface of the main part-located region, and wherein a rear surface of the base may be covered with a metal with low emissivity compared to emissivity of a material forming the base.

(8) The main part may include the light source and the gas cell, and wherein the photodetector may be separately disposed from the main part.

(9) The main part may be disposed on the insulating film, wherein an optical element accommodated in a container, the container being the first component, may be disposed between the light source and the gas cell, wherein the light source implemented in a bonding pattern formed on an upper surface of the container may be disposed at an upper most part of the main part, wherein the gas cell, the gas cell being the second component, may be disposed between the container and the insulating film, and wherein connecting terminals of the light source may be respectively connected to pads formed on the insulating film through, at least, the electrically conductive films formed on the side surfaces of the container and the electrically conductive films formed on the side surfaces of the gas cell.

(10) The photodetector may be disposed on a side of the insulating film opposite to the other side of the insulating film on which the main part is disposed, and wherein the excitation light emitted from the light source may pass through an optical element and the gas cell and may pass through an opening formed in the insulating film to enter the photodetector.

(11) Connecting terminals of the photodetector may include an anode terminal and a cathode terminal, and wherein gold bumps may be respectively formed at the anode terminal and the cathode terminal of the photodetector.

(12) A plurality of bonding patterns may be formed on each of the bonding surfaces, the plurality of bonding patterns being extended from one of the electrically conductive films formed on the side surfaces.

(13) A material of the electrically conductive film may include gold.

(14) The electrically conductive film may include a layer of an insulator as a lower layer.

(15) A melting point of a first bonding material for bonding the first component and the second component may be different from a melting point of a second bonding material for bonding the second component and a third component of the plurality of components.

(16) One of the the first bonding material and the second bonding material may be AuSn solder.

The atomic oscillator and the method for manufacturing an atomic oscillator are described above by the embodiments. However, the present invention is not limited to the specifically disclosed embodiments, and variations and modifications may be made without departing from the scope of the present invention.

The present application is based on and claims the benefit of priority of Japanese Priority Application No. 2016-205458, filed on Oct. 19, 2016, and Japanese Priority Application No. 2017-143950, filed on Jul. 25, 2017, the entire contents of which are hereby incorporated herein by reference.

What is claimed is:

1. An atomic oscillator comprising:
a plurality of components, the plurality of components including
a light source that emits excitation light,
a gas cell in which an atom to be excited by the excitation light is sealed, and
a photodetector that detects the excitation light transmitting through the gas cell; and
a main part, wherein at least apart of the plurality of components is laminated in the main part,
wherein, in a first component and a second component adjacent to each other of the main part, an electrically conductive film is formed on each of side surfaces of the first component and the second component; bonding patterns that are extended from the respective electrically conductive films and that face each other are formed on respective bonding surfaces facing each other of the first component and the second component; and the bonding patterns that face each other are bonded by a bonding material.

2. The atomic oscillator according to claim 1, wherein the photodetector includes, as connecting terminals, an anode terminal and a cathode terminal,
wherein the electrically conductive film is divided, and one of the divided electrically conductive film is connected to the anode terminal and the other divided electrically conductive film is connected to the cathode terminal.

3. The atomic oscillator according to claim 2, wherein the photodetector is coupled to one surface of the first component on which the divided electrically conductive films are formed, and the second component is coupled to the other surface of the first component.

4. The atomic oscillator according to claim 1, wherein the main part includes the light source, the gas cell that is the first component, and the photodetector,
wherein the main part is disposed on an insulating film,
wherein, at an upper most part of the main part, the photodetector that is flip-chip implemented on the bonding pattern formed on an upper surface of the gas cell is disposed,
wherein the second components is disposed between the gas cell and the insulating film, and
wherein the photodetector includes connecting terminals, and the connecting terminals of the photodetector are respectively connected to pads formed on the insulating film through, at least, the electrically conductive films formed on the side surfaces of the first component and the electrically conductive films formed on the side surfaces of the second component.

5. The atomic oscillator according to claim 4, wherein the second component is a container for accommodating an optical element disposed between the light source and the gas cell.

6. The atomic oscillator according to claim 4, wherein the second component is an optical element disposed between the light source and the gas cell.

7. The atomic oscillator according to claim 4, wherein the insulating film includes
an outer peripheral region having a frame shape,
a main part-located region disposed at an inner side of the outer peripheral region, the main part-located region being separated from the outer peripheral region, and
a bridge part that bridges the outer peripheral region and the main part-located region to support the main part-located region,
wherein the main part is disposed on an upper surface of the main part-located region,
wherein at least one of the plurality of components has a hollow structure,
wherein a base is provided on a lower surface of the main part-located region, and
wherein a rear surface of the base is covered with a metal with low emissivity compared to emissivity of a material forming the base.

8. The atomic oscillator according to claim 1, wherein the main part includes the light source and the gas cell, and
wherein the photodetector is separately disposed from the main part.

9. The atomic oscillator according to claim 8, wherein the main part is disposed on the insulating film,
wherein an optical element accommodated in a container, the container being the first component, is disposed between the light source and the gas cell,
wherein the light source implemented in a bonding pattern formed on an upper surface of the container is disposed at an upper most part of the main part,
wherein the gas cell, the gas cell being the second component, is disposed between the container and the insulating film, and
wherein connecting terminals of the light source are respectively connected to pads formed on the insulating film through, at least, the electrically conductive films formed on the side surfaces of the container and the electrically conductive films formed on the side surfaces of the gas cell.

10. The atomic oscillator according to claim 9, wherein the photodetector is disposed on a side of the insulating film opposite to the other side of the insulating film on which the main part is disposed, and
wherein the excitation light emitted from the light source passes through an optical element and the gas cell and passes through an opening formed in the insulating film to enter the photodetector.

11. The atomic oscillator according to claim 9, wherein connecting terminals of the photodetector include an anode terminal and a cathode terminal, and
wherein gold bumps are respectively formed at the anode terminal and the cathode terminal of the photodetector.

12. The atomic oscillator according to claim 1, wherein a plurality of bonding patterns is formed on each of the bonding surfaces, the plurality of bonding patterns being extended from one of the electrically conductive films formed on the side surfaces.

13. The atomic oscillator according to claim 1, wherein a material of the electrically conductive film includes gold.

14. The atomic oscillator according to claim 1, wherein the electrically conductive film includes a layer of an insulator as a lower layer.

15. The atomic oscillator according to claim 1, wherein a melting point of a first bonding material for bonding the first component and the second component is different from a melting point of a second bonding material for bonding the second component and a third component of the plurality of components.

16. The atomic oscillator according to claim 15, wherein one of the the first bonding material and the second bonding material is AuSn solder.

17. A method for manufacturing an atomic oscillator, wherein the atomic oscillator includes
a plurality of components, the plurality of components including
a light source that emits excitation light, a gas cell in which an atom to be excited by the excitation light is sealed, and a photodetector that detects the excitation light transmitting through the gas cell; and a main part, wherein at least a part of the plurality of components are laminated in the main part, the method comprising:

forming, in a first component and a second component adjacent to each other of the main part, an electrically conductive film on each of side surfaces of the first component and the second component and forming bonding patterns that are extended from the respective electrically conductive films and that face each other on respective bonding surfaces facing each other of the first component and the second component; and bonding the bonding patterns facing each other by a bonding material.

18. The method for manufacturing the atomic oscillator according to claim 17, wherein the bonding by the bonding material is performed in a formic acid reducing atmosphere.

* * * * *